United States Patent [19]

Sano et al.

[11] 4,000,411
[45] Dec. 28, 1976

[54] MOS LOGIC CIRCUIT

[75] Inventors: Kenji Sano, Osaka; Hiroaki Arai, Tenri, both of Japan

[73] Assignee: Sharp Kabushiki Kaisha, Osaka, Japan

[22] Filed: Apr. 23, 1975

[21] Appl. No.: 570,825

[30] Foreign Application Priority Data

Apr. 23, 1974 Japan .............................. 49-46211

[52] U.S. Cl. .............................. 307/205; 307/214; 307/DIG. 1
[51] Int. Cl.² .................. H03K 19/08; H03K 19/40
[58] Field of Search ............ 307/205, 214, DIG. 1, 307/270, 208

[56] References Cited

UNITED STATES PATENTS

| | | | |
|---|---|---|---|
| 3,250,917 | 5/1966 | Hofstein | 307/205 |
| 3,395,291 | 7/1968 | Bogert | 307/205 |
| 3,515,899 | 6/1970 | May | 307/214 X |
| 3,675,144 | 7/1972 | Zuk | 307/214 X |
| 3,755,690 | 8/1973 | Smith | 307/DIG. 1 |
| 3,832,574 | 8/1974 | Leehan | 307/205 |

*Primary Examiner*—John S. Heyman
*Assistant Examiner*—Larry N. Anagnos
*Attorney, Agent, or Firm*—Stewart and Kolasch

[57] ABSTRACT

A MOS logic circuit includes a source follower circuit arrangement consisting of a driver MOS element, in addition to a transfer MOS element, an inverter MOS element and a load MOS element. The transfer MOS element receives input signals at its source and produces output signals at its drain, the output signals being applied to the gate of the driver MOS element contained within the source follower circuit arrangement. The resulting output signals developed at the source of the driver MOS element are supplied to the inverter MOS element. This permits the slice or boundary level between the logical 1 and 0 to be higher than the given threshold level of the MOS elements.

4 Claims, 15 Drawing Figures

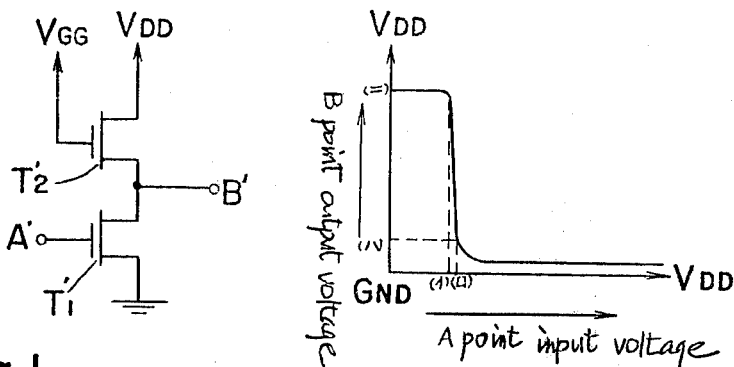
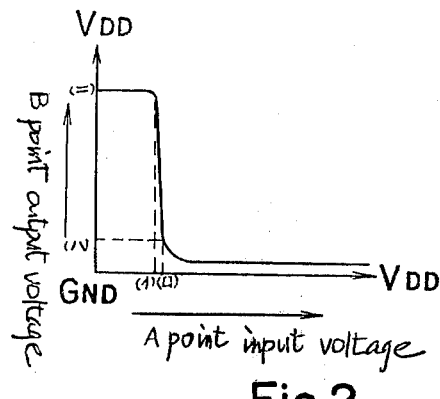
Fig.1
Fig.2
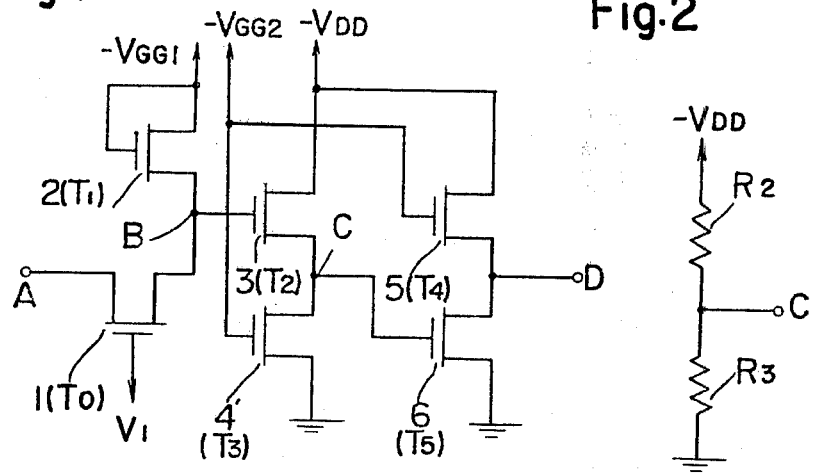
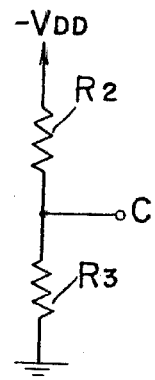
Fig.3
Fig.4
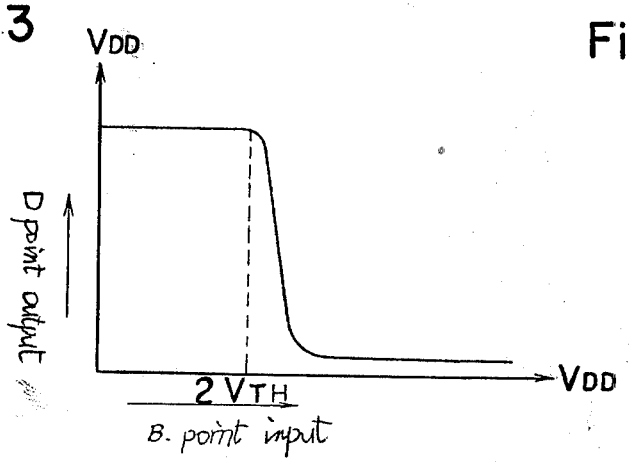
Fig.5

MOS LOGIC CIRCUIT

BACKGROUND OF THE INVENTION

1. Field of the Invention

This invention relates to a MOS logic circuit suitable for circuit integration technology.

2. Brief Description of the Prior Art

In the conventional inverter circuit implemented with MOS circuit integration technology, as illustrated in FIG. 1, a driver MOS transistor $T_1'$ is operatively coupled with a load MOS transistor $T_2'$ such that an input signal is applied to the gate of the driver MOS transistor $T_1'$ via the point A' and then an output signal is derived from the joint terminal B' of the transistors $T_1'$ and $T_2'$. The curve of FIG. 2 shows the input-output characteristic of such inverter circuit. When the input signal is below a given level, the driver MOS transistor $T_1'$ is not conducting and the output signal at the point B is held at the constant value. If the input signal at the point A' exceeds the threshold level of the MOS transistor $T_1'$, current will begin to flow through the MOS transistor $T_1'$ at the point (I) and thereby to initiate logical inversion of the input signal. If the input signal at the point A' reaches the value as designated by the point (II), the output signal at the point B' will show the value as designated by the point (III), thereby logically inverting the next succeeding circuit connected to the point B'. Accordingly, the boundary level between the logical 1 and 0 with respect to the input signals to the point A' is limitedly placed adjacent the threshold level of the MOS transistor $T_1'$ which is largely determined pursuant to conditions of fabrication of MOS integrated circuit. Modification of the logical boundary or slice level of the input signal to the point A' requires the necessity for altering the threshold level of the MOS transistor $T_1'$ during the fabrication process and thus providing an additional process therefor.

SUMMARY OF THE INVENTION

The present invention provides a logical inverter circuit implemented with MOS integrated circuit technology having capability of increasing the slice level of the input logic 1 and 0 well above the threshold level of the MOS transistor. The present invention also permits various circuits having different logical slice levels to be incorporated into the same MOS integrated circuit and, from the viewpoint of this, is much effective for MOS integrated circuit input systems.

In order to accomplish the objective set forth above, pursuant to the principle of the present invention, input signals are supplied to the source of a MOS element of the enhancement mode having a load MOS element therefor while output signals from the drain of the enhancement mode MOS element are supplied to the gate of a driver MOS element arranged in the form of source follower, the output signals from the source of the driver MOS element being supplied to the last-stage inverter gate. This enables arbitrary choice of the input logic slice level over the unique threshold level inherent to the MOS elements.

BRIEF DESCRIPTION OF THE DRAWINGS

Other objects and many of the attendant advantages of the present invention will be readily appreciated as the same becomes better understood by reference to the following detailed description which considered in conjunction with the accompanying drawings in which like reference numerals designate like parts throughout the figures thereof, and wherein:

FIG. 1 is an electrical circuit illustration of the prior art MOS inverter circuit.

FIG. 2 is an input-output characteristic chart with respect to the circuit shown in FIG. 1.

FIG. 3 is an electrical circuit illustration of one of preferred embodiments embodying the present invention.

FIG. 4 is an electrical circuit illustration of an equivalent circuit of a portion of the circuit of FIG. 3.

FIG. 5 is an input-output characteristic chart with respect to the circuit of FIG. 3.

DESCRIPTION OF THE PREFERRED EMBODIMENTS

Figures 6, 7, 8:
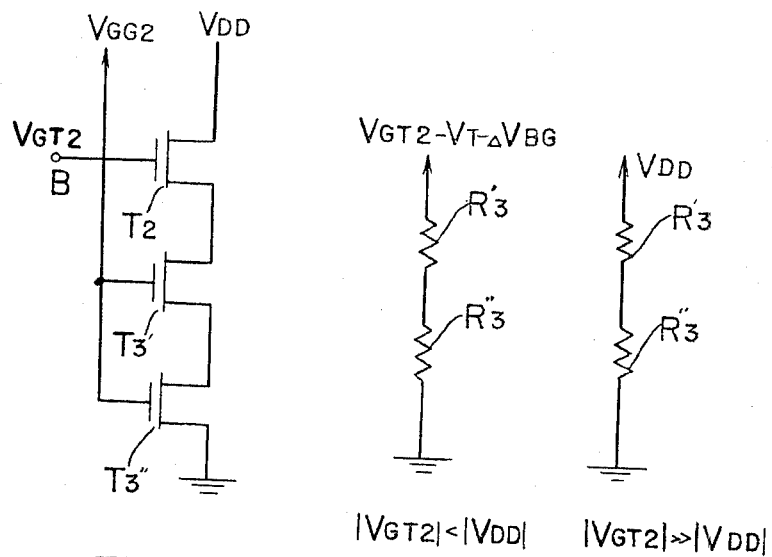
FIG. 6 is an electrical circuit illustration of a portion of another preferred embodiment embodying the present invention.
FIGS. 7 and 8 are electric circuit illustrations of an equivalent circuit of FIG. 6.

FIG. 3 illustrates an electrical connection illustration of one preferred embodiment embodying the present invention, which includes a transfer MOS element 1 (referred to as "$MOST_0$" hereinafter), load MOS elements 2, 4 and 5 (referred to as "$MOST_1$", "$MOST_3$" and "$MOST_4$" hereinafter) and driver MOS elements 3 and 6 (referred to as "$MOST_2$" and "$MOST_5$" hereinafter).

The source of the transfer $MOST_0$ receives an input signal applied thereto via the point A, the drain of which is coupled with the load $MOST_1$. This junction is designated as the point B and is coupled with the gate of the driver $MOST_2$, which has the source coupled with the load $MOST_3$. The junction between the source of the driver $MOST_2$ and the load $MOST_3$ is designated as the point C and is coupled with the gate of the driver $MOST_5$ of which the source is coupled with the load $MOST_4$ at the junction D. As shown in the drawing, the voltage supplies to the $MOST_1$, $MOST_2$, $MOST_3$ and $MOST_4$ are designated as $-V_{GG1}$, $-V_{GG2}$ and $-V_{DD}$, respectively.

With such an arrangement, the input signal is applied to the point A and to the point B in a source follower circuit comprising the two $MOST_2$ and $MOST_3$ via the transfer $MOST_0$. The output signal developed at the point C in the source follower circuit is then applied to an inverter circuit comprising the two $MOST_5$ and $MOST_4$, the inverter circuit providing at the point D the resultant inversion of the input signal.

Assume now in order to facilitate understanding of the principle of the present invention that all the elements in the circuit of FIG. 3 are conventional P channel MOS elements of the enhancement mode and the threshold levels and the substrate bias effects of the respective MOS elements take the substantially same value.

The following description is for the operation of the circuit portion between the points B and D.

If the point B is at ground level, then the point C also will be at ground level and at this time the point D will be at $-V_{DD}$ level. The level on the point B is then forced into a particular negative region beyond the threshold level of the $MOST_2$. Provided that the level on the point B is designated as $-V_{GT2}$ and the threshold level of the $MOST_2$ is designated as $-V_{T2}$, the level on the point C will be represented as below.

The point C level $\approx -V_{GT2} - (-V_{T2} - \Delta V_{BG2})$  (1)

wherein $\Delta V_{BG2}$ is increment of the threshold level due to the substrate bias effect.

Further, the circuit including the $MOST_2$ and $MOST_3$ may be equivalently shown in FIG. 4 when the respective resistance values of the $MOST_2$ and $MOST_3$ are $R_2$ and $R_3$. The following equation will be clear from FIG. 4.

$$\text{the point C level} = \frac{R_3}{R_2 + R_3}(-V_{DD})$$ (2)

(2)

However, the level on the point C does not go into the negative region beyond the value expressed by the equation (1) at all. This follows that the level on the point C always is higher than the level on the point B by at least the threshold level $V_{T2}$.

Current will flow through the $MOST_5$ in response to the level on the point C below the threshold level $-V_{T5}$ of the $MOST_5$. Therefore, under the circumstances, the level on the point B should be below $(-V_{T2} - V_{T5})$. If such requirement is not satisifed, no current will flow through the $MOST_5$ and the level on the point D will be at $-V_{DD}$ level.

Since all the enhancement elements within the same MOS integrated circuit assume the substantial same threshold level (i.e., $-V_{T2} \approx -V_{T5} = V_{TH}$), the input-output characteristic between the points B and D will take the form as shown in FIG. 5.

Comparison with the simple inverter characteristic as shown in FIG. 2 shows that the slice level between the logical 1 and 0 as regards the input signals to the point B is twice as high as the threshold level $V_{Th}$ of the MOS element and therefore $2V_{TH}$.

When the logical 1 and 0 levels are considered as the high level H (ground potential) and the low level L ($-V_{DD}$ potential), the circuit path between the points B and D will constitute an inverter circuit and the slice level between the logical 1 and 0 is about $-2V_{TH}$. Taking difference $\pm \Delta V_{TH}$ in the threshold levels of the MOS elements due to the conditions of fabrication thereof and the increment $-\Delta V_{BG}$ of the threshold levels thanks to the substrate bias (or back gate) effects into consideration, the slice level between the logical 1 and 0 is approximately expressed as follows.

$-2(V_{TH} \pm \Delta V_{TH}) - \Delta V_{BG}$

The $MOST_0$ and $MOST_1$ operate in the following manner. The $MOST_1$ is provided for the purpose of ensuring the level on the point B and, in the absence of the input signals to the point A, the B point level can be expressed below.

$-V_{GG1} - (-V_{T1} - \Delta V_{BG1})$  (3)

where $V_{T1}$ is the threshold level of the $MOST_1$

The value for $-V_{GG1}$ in the equation (3) is chosen as follows:

$-V_{GG1} - (-V_{T1} \pm \Delta V_{T1} - \Delta V_{BG1}) << -V_{T2} \pm \Delta V_{T2}$
$- \Delta V_{BG2} - V_{T5} \pm \Delta V_{T5}$  (4)

The above equation (4) can be rewritten below under the assumption that $V_T$, $\Delta V_T$ and $V_{BG}$ of the respective MOS elements take the substantially same value.

$-V_{GG1} << -3(V_T \pm \Delta V_T) - 2\Delta V_{BG}$  (5)

The gate voltage $V_1$ of the $MOST_0$ is chosen to be below its threshold level namely, to establish the following relation.

$-V_{GG1} < -V_1 < -V_T$  (6)

The resistance values $R_{T0}$ and $R_{T1}$ of the $MOST_0$ and $MOST_1$ are correlated as $R_{T0} << R_{T1}$.

When the level on the point A falls to the level $-V_1 + V_T$, the $MOST_0$ is non-conducting and the level on the point B is L such that the resultant conduction of the $MOST_2$ renders the level on the point C low (L). As a result, the $MOST_5$ is conducting and the level on the point D is H. This leads to the conclusion that the logical level on the point D is L.

Conversely, if the level on the point A is increased to satisfy the relation the point A level ($\approx$ the point B level be cause of $R_{T0} << R_{T1}$) $> -2V_{TH}$, the $MOST_5$ will be rendered non-conducting so that the level on the point D shows L. In other words, the logical state on the point D is 0.

Although the source follower circuit comprising the $MOST_2$ and $MOST_3$ is illustrated as being a simple load MOS circuit in FIG. 3, its equivalent circuit under the conditions that the $MOST_3$ is divided into $MOST_3'$ and $MOST_3''$ and the $MOST_2$ is conducting, is illustrated in FIGS. 7 and 8. In these drawings $R_3'$ and $R_3''$ are the respective resistance values of the $MOST_3'$ and $MOST_3''$. FIG. 7 shows the equivalent circuit when $|V_{GT2}| < |V_{DD}|$, while FIG. 8 shows that when $|V_{GT2}| >> |V_{DD}|$. In this manner, the slice level between the logical 1 and 0 may be optionally selected by varying the values corresponding to $R_3$ set forth in the equation (2).

Figures 9, 10, 11:
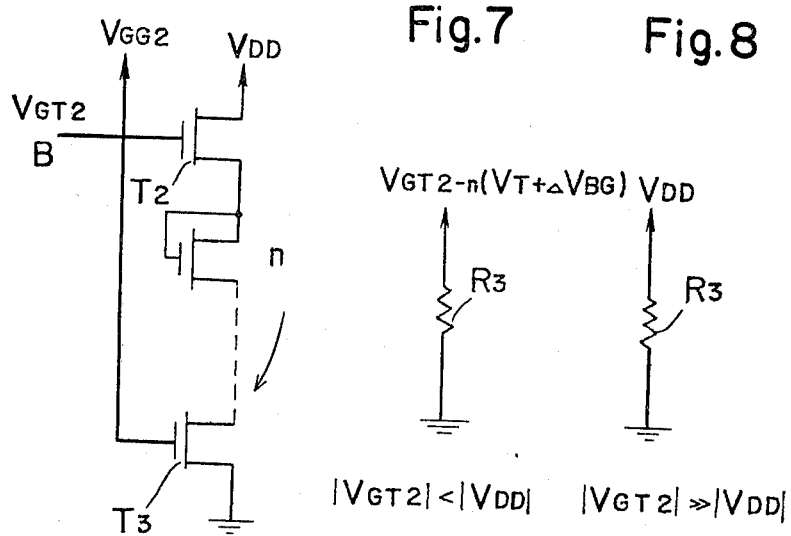
FIG. 9 is an electrical circuit illustration of a portion of still another preferred embodiment embodying the present invention.
FIGS. 10 and 11 are electrical circuit illustrations of an equivalent circuit of FIG. 9.

In the case that a plurality (the number : n) of enhancement mode MOS elements are connected in series with the enhancement mode $MOST_2$, its equivalent circuit under the circumstance that the $MOST_2$ is conductive is suggested by FIGS. 10 and 11. FIG. 10 suggests the equivalent circuit when $|V_{GT2}| < |V_{DD}|$, while FIG. 11 suggests that when $|V_{GT2}| >> |V_{DD}|$. In these drawings the enhancement MOS elements connected in series with the $MOST_2$ are regarded to have extemely small resistance values as compared with the resistance value $R_3$ of the $MOST_3$ and therefore are not shown. In this manner, the slice level between 1 and 0 may be optionally selected.

It will be understood from the foregoing that although the $MOST_0$ should be of the enhancement mode, the remaining MOS elements may be of either the enhancement mode or the depletion mode. The $MOST_0$, $MOST_2$ and $MOST_5$ are generally of the enhancement mode, the conductivity type of which may be of either the P channel type or the N channel type.

Effective utilization of the significant features of the logic circuit of the present invention will be described below by way of example. In the case that the logical 1 or 0 levels of the signals applied from the outside to LSI (large scale integrated circuit implemented with MOS elements of the P channel and low (L) threshold level) are different from each other and the threshold levels of the enhancement mode MOS elements are − 1.5 − 0.5 volts, the high (H) level of the input signal should be above − 1.0 taking any possible deviation into consideration provided that the input signals are applied directly to the inverter gate as taught by the prior art.

In the illustrative application of the present invention, the power supplies in FIG. 3 are chosen − 18 volts and − 6 volts. The threshold level inherent to the circuit of FIG. 12 can be expressed by the following formula under the assumption that the threshold levels, the substrate bias effects and deviations in the threshold levels are substantially equal among the internal MOS elements.

$$- 2 ( V_{TH} \pm \Delta V_{TH} ) - \Delta V_{BG}$$

If $\Delta V_{BG} \approx 0$, the H level of the input signals may be above − 2 volts while the L level thereof may be below − 4 volts.

Because of the gate voltage of the $MOST_0$ being − 6 volts, when the level on the point A is − 6 − ( 1.5 ± 0.5 ) volts, i.e, below − 5 volts, the $MOST_0$ is turned on such that no current path to the $MOST_0$ and $MOST_1$ is provided even if the L level is − 5 volts. Therefore, in the case that input circuit consitutes an implementation as shown in FIG. 13 ( 11 is a transistor and 12 is a resistor ), no current flow is established from the power supply − 5 volts to the power supply − 18 volts via the resistor 12 and the MOS To and $MOST_1$ (FIG. 12) even if the transistor 11 is placed at its conductive state.

Figure 14:
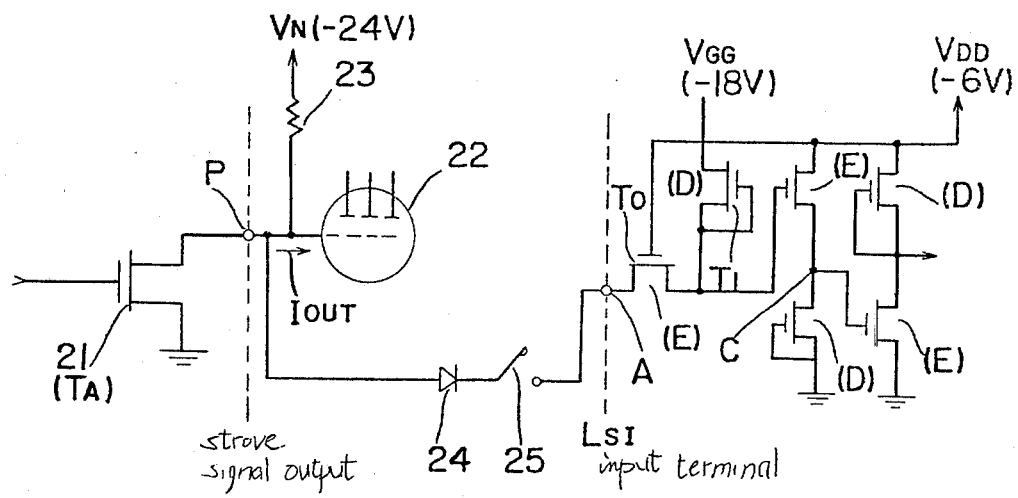

Such an example may be frequently found in calculator LSI's from which a set of strove (time-sharing) signals are derived to serve both for display and key entry functions. Such an application is suggested in FIG. 14. The right portion to the point A in FIG. 14 is the equivalency to that shown in FIG. 12. The synbols (E) and (D) in FIG. 14 represent MOS elements of the enhancement mode and the depletion mode, respectively.

Figure 12:
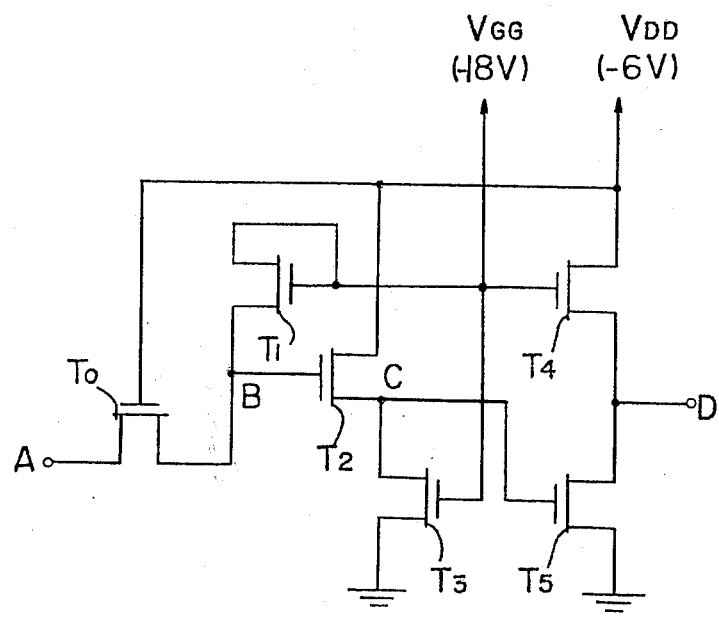
FIG. 12 is an electrical circuit illustration of one application of the present invention.
Figure 13:
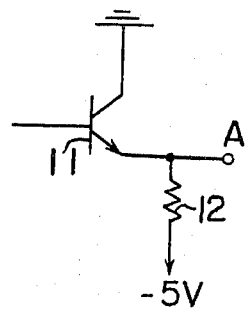
FIGS. 13 through 15 are electrical circuit illustrations of external input circuits.

In FIG. 14, 21 designates a MOS element ( $MOST_A$ ) of the enhancement mode, P designates an output terminal for the strove signals, 22 designates a fluorescent indication tube, 23 designates a resistor, 24 designates a diode, 25 designates a key, and A designates an input terminal of LSI as shown in FIG. 12.

The layout of FIG. 14 is adapted such that conduction of the $MOST_A$ enables the fluorescent indication tube, the conduction current being designated as I out. The level on the point P is reduced below ground potential by a component $R_{TA} \times |$ I out $|$ (where $R_{TA}$ is the resistance value of the $MOST_A$ at its conduction state) in the presence of the current I out. This level on the point P is entered into LSI through the diode 24 and the key 25. If the input level to the terminal A falls below the threshold level of the enhancement MOS element, that input level can not be sensed provided that as suggested in the prior art the input signal will be applied directly to the gate (corresponds to the point C of FIGS. 12 and 14) of the simple inverter circuit. To this end, it is essential to render the $MOST_A$ large-scale and to alter the threshold levels of MOS elements within the input circuit during fabrication of LSI. This requires provision of an additional fabrication process.

Nevertheless, as discussed with regard to the circuit of FIG. 12 in accordance with the present invention, current does not flow through the $MOST_0$ and $MOST_1$ toward the power supply $V_{GG}$ ( − 18 volts ) at all even when the input level on the point A falls down, the decrement thereof being twice as large as the threshold level of the enhancement mode MOS element. The arrangement of the present invention can preclude the requirements discussed above for rendering the $MOST_A$ large and altering the threshold levels during fabrication.

Figure 15:
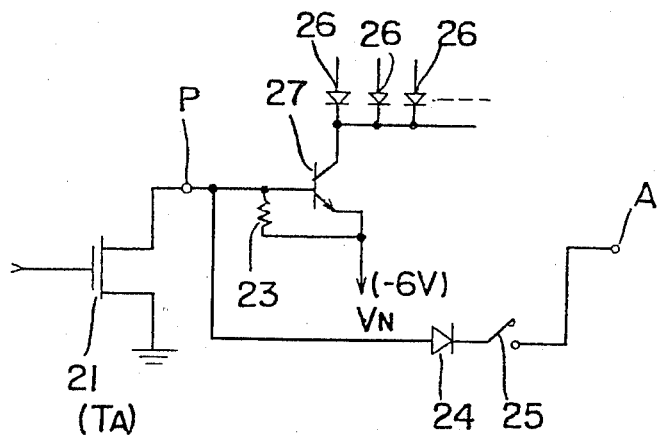

The advantages discussed with respect to FIG. 14 also are obtainable in the instance where as shown in FIG. 15 there are provided a plurality of diodes 26 responsive to segment signals and a transistor 27.

In applying the input signals of the circuits of FIGS. 14 and 15 to the point A of FIG. 12, although the input signals are applied to the point B with removal of the $MOST_0$ of FIG. 12, the circuit embodying the present invention will be still operational. This, however, leads to that, when the $MOST_A$ of FIG. 14 is non-conductive, current flows from the power supply $V_{GG}$ ( − 18 volts ) to the power supply $V_N$ ( − 24 volts ) because of the $MOST_1$ being of the depletion mode such that the level on the point P is placed in an intermediate range between $V_N$ and $V_{GG}$. And, when the $MOST_A$ of FIG. 15 is non-conductive, the P point level is placed in the range between $V_N$ and $V_{GG}$ due to conduction current from the power supply $V_N$ ( − 6 volts ) to the power supply $V_{GG}$ ( − 18 volts ).

It is concluded that the present invention is widely applicable to the various circuits having different input levels (particularly, L level) by proper choice of the voltage applied to the gate of the $MOST_0$ shown in FIG. 12.

While only certain embodiments of the present invention have been described, it will be apparent to those skilled in the art that various changes and modifications may be made therein without departing from the spirit and scope of the invention as claimed.

What is claimed is:

1. A MOS logic circuit comprising:
   a transfer MOS element for receiving and transferring an input signal having either of the logical levels 1 and 0;
   an inverter MOS element which delivers an output signal in accordance with the logical levels 1 and 0 of an input signal applied thereto, and
   a source follower circuit interconnecting said transfer MOS element and said inverter MOS element, said source follower circuit comprising at least two MOS elements having source and drain paths connected in series to increase the boundary level between logical 1 and 0 in said output signal from said inverter over that of said input signal applied to said transfer MOS element.

2. A MOS logic circuit as set forth in claim 1 wherein the transfer MOS element is of the enhancement mode.

3. A MOS logical inverter circuit means having an enhanced slice level between logical 1 and 0 states comprising:
   a transfer circuit including a transfer MOS element of the enhancement mode for receiving and transferring an input signal having either of logical levels 1 and 0 and a load MOS element for said MOS transfer element;
   a source follower circuit comprising a driver MOS element having an intermediate output node and an input electrode driven by said transferred input signal from said transfer MOS element and at least one load MOS element having a load path in series with said intermediate output node of said driver MOS element; and an inverter circuit including an inverter MOS element having an input electrode and an output node, said input electrode being coupled with the said intermediate output node of the said driver MOS element within the said source follower circuit to provide an inversion of said input signal with an enhanced slice level at said output node in response to a signal at said intermediate output node.

4. A MOS logic circuit as set forth in claim 1 wherein the transfer MOS element, the inverter MOS element and the source follower circuit elements are all incorporated into an integrated circuit.

* * * * *